(12) United States Patent
Setoyama et al.

(10) Patent No.: US 6,998,034 B2
(45) Date of Patent: Feb. 14, 2006

(54) VACUUM ARC DEPOSITION APPARATUS

(75) Inventors: Makoto Setoyama, Kyoto (JP);
Kazuhiko Irisawa, Kyoto (JP); Hideo Yanashima, Kyoto (JP)

(73) Assignees: Nissin Electric Co., Ltd., Kyoto (JP);
Nippon ITF Inc., Kyoto (JP)

( * ) Notice: Subject to any disclaimer, the term of this patent is extended or adjusted under 35 U.S.C. 154(b) by 244 days.

(21) Appl. No.: 10/622,495

(22) Filed: Jul. 21, 2003

(65) Prior Publication Data
US 2004/0134771 A1    Jul. 15, 2004

(30) Foreign Application Priority Data
Jul. 22, 2002    (JP)    .......................... P2002-212044

(51) Int. Cl.
*C23C 14/34*    (2006.01)
*C23C 16/00*    (2006.01)

(52) U.S. Cl. .................... 204/298.41; 204/192.38; 118/723 VE

(58) Field of Classification Search ........... 204/298.41, 204/192.38; 118/723 VE, 723 MP
See application file for complete search history.

(56) References Cited

U.S. PATENT DOCUMENTS 5,254,237 A * 10/1993  Snaper et al. .......... 204/298.41
5,294,322 A *  3/1994  Vetter et al. ........... 204/298.41

FOREIGN PATENT DOCUMENTS

JP           2002-25794          1/2002

* cited by examiner

*Primary Examiner*—Rodney G. McDonald
(74) *Attorney, Agent, or Firm*—Finnegan, Henderson, Farabow, Garrett & Dunner, L.L.P.

(57) ABSTRACT

An arc evaporation source constituting this vacuum arc deposition apparatus has a plurality of cathodes, a trigger electrode, a trigger drive unit, a shutter, and a shutter drive unit. The trigger drive unit changes over the position of the trigger electrode to thereby position the trigger electrode in front of a desired cathode, and connects/disconnects the trigger electrode to/from the desired cathode in the changed-over position. The shutter covers the fronts of all the cathodes except the desired cathode. The shutter drive unit moves the shutter to thereby change over the cathode not covered with the shutter. Further, the vacuum arc deposition apparatus has a changeover control unit for controlling the shutter drive unit and the trigger drive unit to thereby change over the cathode not covered with the shutter and to thereby position the trigger electrode in front of the cathode not covered with the shutter.

10 Claims, 4 Drawing Sheets

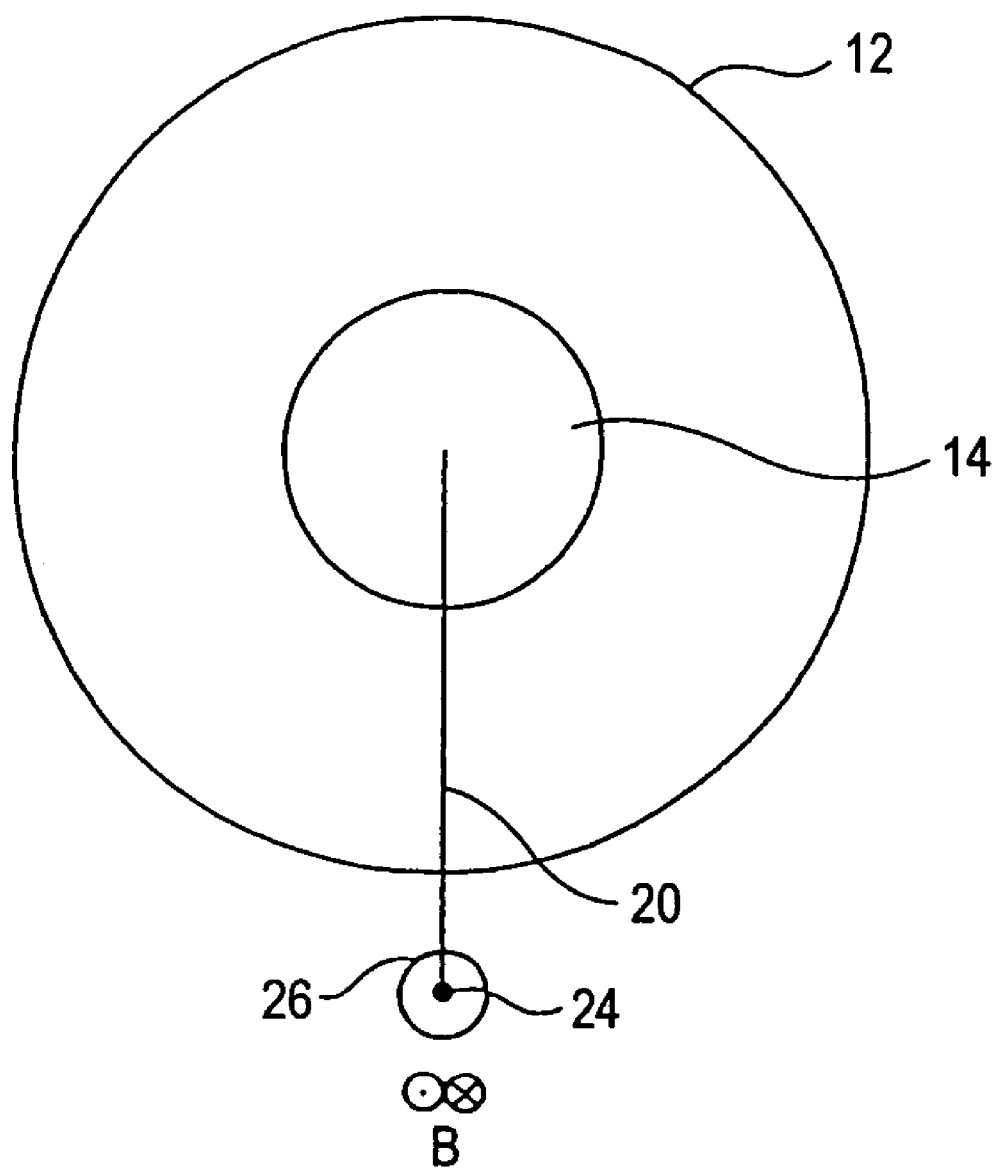

VACUUM ARC DEPOSITION APPARATUS

BACKGROUND OF THE INVENTION

1. Field of the Invention

The present invention relates to vacuum arc deposition apparatus having an arc evaporation source for evaporating a cathode material due to vacuum arc discharge and depositing the cathode material on a substrate so as to form a thin film. It particularly relates to means for making it possible to prolong the film deposition time or to enhance the degree of freedom to form a laminated film.

2. Description of the Related Art

FIG. 4 shows an example of such vacuum arc deposition apparatus in the related art, and FIG. 5 shows a view taken from the arrow P.

This vacuum arc deposition apparatus has a vacuum chamber 2 to be vacuum-evacuated by a not-shown vacuum pumping system. A holder 6 for holding a substrate 4 to be filmed is provided in the vacuum chamber 2. An arc evaporation source 10 is attached to a side wall portion of the vacuum chamber 2 so as to face the substrate 4 on the holder 6 in this example.

The arc evaporation source 10 evaporates a cathode material 16 from a cathode 14 due to vacuum arc discharge. More specifically, the arc evaporation source 10 has a cathode holder 12 made from a conductor (for example, non-magnetic metal) and for holding the cathode 14. One cathode 14 is attached to the cathode holder 12 in the related art. The cathode holder 12 is attached to the vacuum chamber 2 through an insulator 18.

The arc evaporation source 10 further includes a trigger electrode 20 and a trigger drive unit 22. The trigger electrode 20 is used for arc ignition in the cathode 14. The trigger drive unit 22 moves the trigger electrode 20 in the front/rear direction of the cathode 14 through a shaft 24 and a feedthrough 26 so as to connect/disconnect (contact/separate) the trigger electrode 20 to/from the cathode 14 as shown by the arrow B. The feedthrough 26 has a vacuum seal function and an electrical insulating function in this example.

The vacuum chamber 2 also serves as an anode of the arc evaporation source 10 in this example. Between the cathode 14 of the arc evaporation source 10 and the vacuum chamber 2 also serving as the anode, a DC arc power supply 28 for arc discharge is connected through the cathode holder 12 and with the cathode 14 on the negative side (in other words, with the vacuum chamber 2 on the positive side). Between the trigger electrode 20 and the positive side of the arc power supply 28 (in other words, the anode or the vacuum chamber 2 also serving as the anode), a resistor 30 for limiting a current in arc ignition is connected through a conductive shaft 24.

An example of the operation will be described as follows. The trigger electrode 20 is moved by the trigger drive unit 22 so as to be once brought into contact with the cathode 14 to which a DC voltage (for example, about several tens of V) is applied from the arc power supply 28. When the trigger electrode 20 is then separated from the cathode 14, a spark occurs between the trigger electrode 20 and the cathode 14. This triggers off continuous arc discharge between the cathode 14 and the vacuum chamber 2 also serving as the anode. Thus, the surface of the cathode 14 is melted so that the cathode material 16 is evaporated. Then, the cathode material 16 is injected and deposited onto the substrate 4 so that a thin film is formed on the surface of the substrate 4.

At that time, a negative bias voltage (for example, about minus several tens of V to about −1,000 V) may be applied from a bias power supply 8 to the substrate 4 on the holder 6. Thus, the adhesion of the thin film to the substrate 4 is improved.

In addition, the holder 6 holding the substrate 4 may be rotated in the arrow E direction or in the reverse direction thereto. Thus, the uniformity of the thin film on the substrate 4 is improved.

In addition, reactive gas (for example, nitrogen gas) reactive to the cathode material 16 or inert gas (for example, argon) not reactive thereto may be introduced into the vacuum chamber 2. When reactive gas is introduced, a compound thin film can be formed on the surface of the substrate 4.

Incidentally, an anode of the arc evaporation source 10 may be provided separately from the vacuum chamber 2. In that case, the positive electrode of the arc power supply 28 and the resistor 30 are connected to the anode while the vacuum chamber 2 is typically grounded. The same thing can be applied to an arc evaporation source 10a constituting vacuum arc deposition apparatus according to the invention, which will be described later.

Although one arc evaporation source 10 is illustrated here, a plurality of arc evaporation sources may be provided if necessary. For example, a total of two arc evaporation sources may be provided so that one is put on the left of the substrate 4 on the holder 6 and the other is put on the right thereof. Alternatively, a total of four arc evaporation sources may be provided so that two are put above and below on the left and the other two are put above and below on the right. The number of arc evaporation sources may be larger than four. The same thing can be applied to the arc evaporation source 10a which will be described later.

In the vacuum arc deposition apparatus, the cathode 14 of the arc evaporation source 10 is consumed with film deposition. When the cathode 14 has been consumed beyond a certain limit, film deposition is blocked. Thus, the film deposition time is limited. When the cathode 14 is worn, it is necessary that the vacuum in the vacuum chamber 2 is broken to open the inside of the vacuum chamber 2 to the atmosphere and exchange the cathode 14 for a new one, and the vacuum chamber 2 is then vacuum-evacuated again. Thus, it takes much time for the exchange work.

When a laminated film (for example, multilayer film) is formed on the surface of the substrate 4 by use of different kinds of cathodes 14, that is, different kinds of cathode materials 16 from each other, kinds of films forming the laminated film are limited by the number of arc evaporation sources 10 aside from the kind of introduced gas. Thus, the degree of freedom to form the laminated film is low.

SUMMARY OF THE INVENTION

It is therefore an object of the invention to provide vacuum arc deposition apparatus in which the time to deposit a film on a substrate can be prolonged or the degree of freedom to form a laminated film can be enhanced.

In a vacuum arc deposition apparatus according to a first aspect of the invention, an arc evaporation source includes a cathode holder made from a conductor for holding the cathode, a plurality of cathodes attached to the cathode holder, a trigger electrode for arc ignition, a trigger drive unit for performing an operation to change over a position of the trigger electrode to thereby position the trigger electrode in front of a desired one of the plurality of cathodes and an operation to move the trigger electrode toward or to get apart from the desired cathode in the changed-over position, a shutter capable of covering fronts of all of the cathodes except the desired cathode, and a shutter drive unit for performing an operation to move the shutter to thereby change over a cathode not covered with the shutter.

The vacuum arc deposition apparatus further includes a changeover control unit for making a changeover control to control the shutter drive unit and the trigger drive unit so as to change over a cathode not covered with the shutter while positioning the trigger electrode in front of the cathode not covered with the shutter.

According to this vacuum arc deposition apparatus, one arc evaporation source has a plurality of cathodes, and the changeover control unit can change over a cathode not covered with the shutter while changing over the position of the trigger electrode so as to position the trigger electrode in front of the cathode not covered with the shutter. Accordingly, the plurality of cathodes can be used while being changed over in the condition that the vacuum chamber is not opened to the atmosphere. Thus, the film deposition operation can be carried out continuously with the plurality of cathodes.

On that occasion, according to the invention, not only is the position of the trigger electrode changed over to change over the cathode to be used, but all the cathodes except the cathode to be used are also covered with the shutter. Accordingly, (a) the cathode material evaporated from the cathode in use can be prevented from adhering to the surface of any other unused cathode by the shutter. Further, (b) arc discharge in the cathode in use can be prevented from shifting to another unused cathode to thereby cause undesired arc discharge by the shutter.

The kinds of the plurality of cathodes provided in the single arc evaporation source maybe made the same as one another or different from one another, or cathodes of the same kind and of different kinds may be mixed in the single arc evaporation source.

When the kinds of cathodes are made the same as one another, the film deposition time can be prolonged in accordance with the number of cathodes in comparison with that when the number of cathodes is one. For example, the film deposition-time can be prolonged as many times as the number of cathodes.

When the kinds of cathodes are made different from one another, a wide variety of films can be formed correspondingly. Thus, the degree of freedom to form a laminated film can be enhanced in comparison with that when the number of cathodes is one. In this case, the effect in the paragraph (a) due to the fact that all the cathodes except the cathode in use are covered with the shutter is particularly effective. That is, if there were, among the unused cathodes, a cathode not covered with the shutter, the cathode material evaporated from the cathode in use (which will be referred to as "first cathode") would adhere to the surface of the cathode not covered with the shutter (which cathode will be referred to as "second cathode"). When a film is next formed with the second cathode, the cathode material adhering to the second cathode would be evaporated so that a film having a composition different from an intended composition would be formed on a substrate for a while. According to the invention, such a problem can be avoided.

When cathodes of the same kind and of different kinds are mixed, not only is it possible to prolong the film deposition time but it is also possible to enhance the degree of freedom to form a-laminated film.

For example, the changeover control unit performs the changeover control in response to a changeover instruction given from the outside (for example, an operator or the like). Alternatively, the changeover control may be performed automatically in the following manner.

That is, in a vacuum arc deposition apparatus according to a second aspect of the invention, an arc current integrator may be further provided for integrating an arc current flowing into the arc power supply via the cathode holder during the current-carrying time so as to obtain an arc current amount, and the changeover control unit is designed to carry out the changeover control whenever the arc current amount obtained by the arc current integrator exceeds a predetermined reference value.

The arc current amount obtained by the arc current integrator is proportional to the degree of consumption of the cathode which is in use at that time. Accordingly, with the configuration, a cathode to be used can be changed over automatically whenever the consumption of the cathode in use reaches a predetermined quantity of consumption.

In a vacuum arc deposition apparatus according to a third aspect of the invention, while the shutter is made from metal, the vacuum arc deposition apparatus may further include a resistor connected between the shutter and the anode or the vacuum chamber also serving as an anode, an ampere meter for measuring a current flowing into the shutter via the resistor, and a shut-down control unit for making a shut-down control for shutting down an output of the arc power supply when the current measured by the ampere meter exceeds a predetermined reference value.

With such a configuration, the resistor can prevent the shutter from floating electrically, while the resistor can reduce the occurrence of abnormal discharge between the shutter and the cathode. This is due to the resistor put between the positive electrode of the arc power supply (in other words, the anode or the vacuum chamber also serving as the anode) and the shutter. That is, when discharge is about to occur from the cathode toward the shutter, the current flowing into the resistor increases so that a voltage drop in the resistor increases to block the abnormal discharge. In addition, when the current flowing into the shutter exceeds a predetermined reference value for some reason, the output of the arc power supply can be shut down automatically by the shut-down control unit. Thus, abnormal discharge in the shutter can be prevented more surely.

BRIEF DESCRIPTION OF THE DRAWINGS

FIG. 5 is a front view showing another example of the vicinity of cathodes of an arc evaporation source in the vacuum arc deposition apparatus in the related art, viewed in the arrow P direction in FIG. 4.

DETAILED DESCRIPTION OF THE INVENTION

Figure 1:
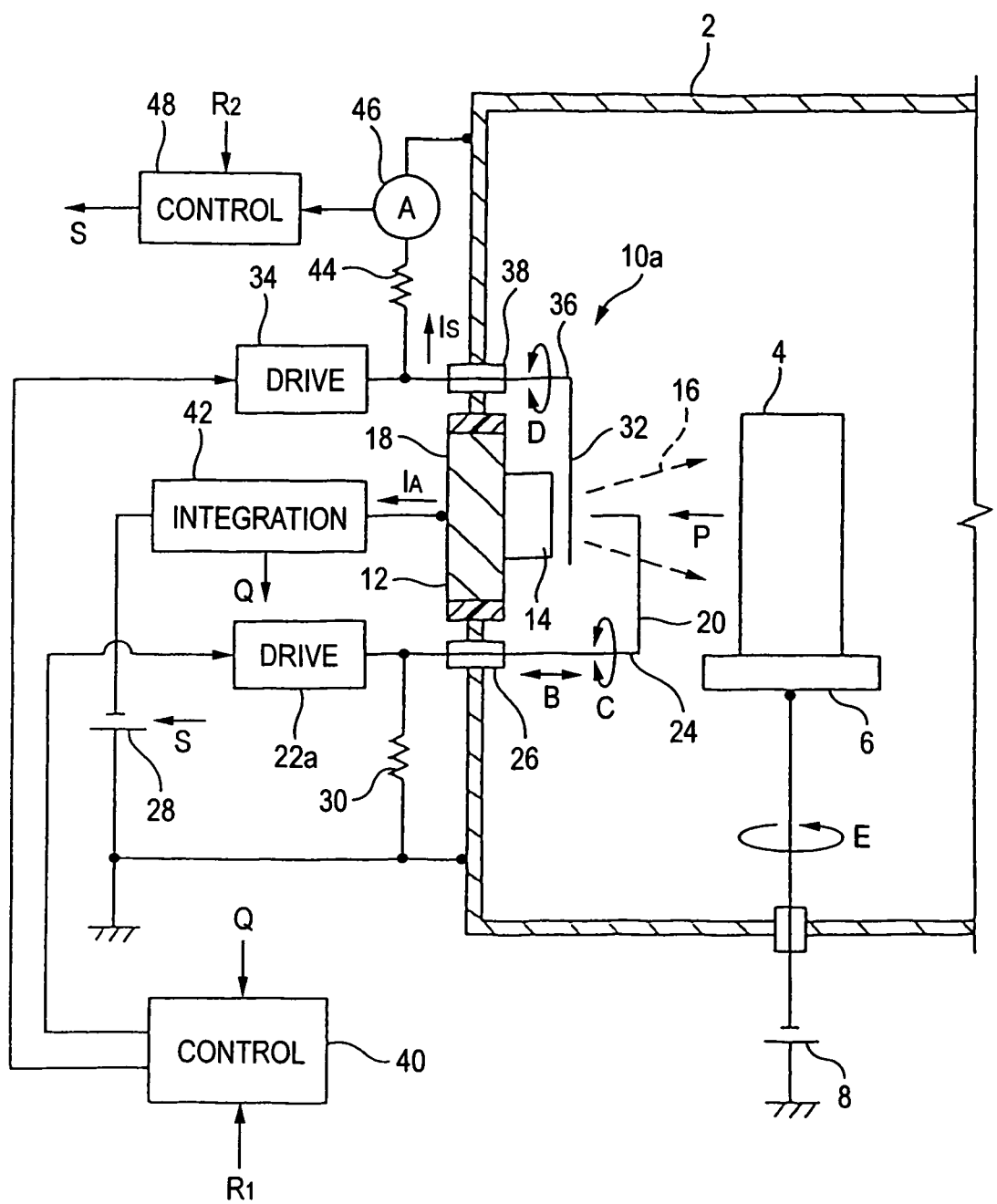
FIG. 1 is a sectional view showing an embodiment of vacuum arc deposition apparatus according to the invention.
Figure 2:
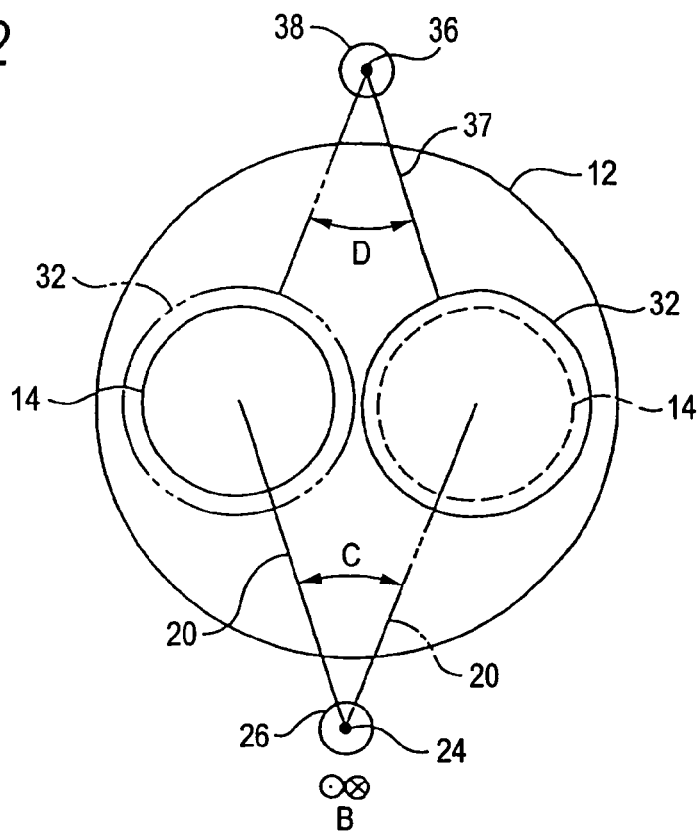
FIG. 2 is a front view showing an example of the vicinity of cathodes of an arc evaporation source in the vacuum arc deposition apparatus according to the invention, viewed in the arrow P direction in FIG. 1.
Figure 4:
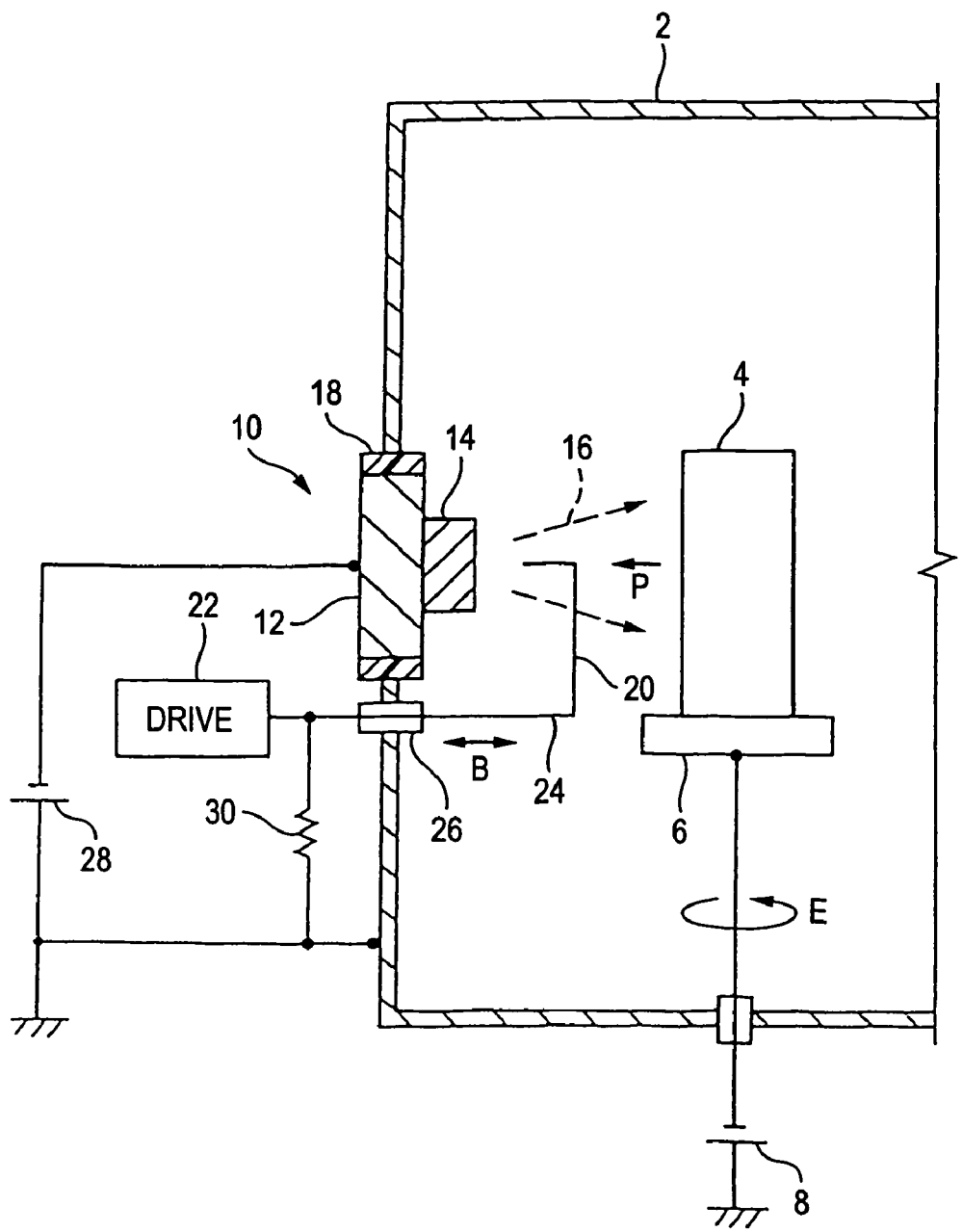
FIG. 4 is a sectional view showing an example of vacuum arc deposition apparatus in the related art.

FIG. 1 is a sectional view showing an embodiment of vacuum arc deposition apparatus according to the invention. FIG. 2 is a front view showing an example of the vicinity of cathodes of an arc evaporation source in the vacuum arc deposition apparatus according to the invention, viewed in the arrow P direction in FIG. 1. Parts the same as or corresponding to those in the related-art example shown in FIGS. 4 and 5 are denoted by the same reference numerals correspondingly, and different points from the related-art example will be chiefly described below.

A vacuum arc deposition apparatus of the present invention has the following arc evaporation source 10a instead of the arc evaporation source 10 in the related art. The number of arc evaporation sources 10a may be either one or plural as described previously.

In this embodiment, the arc evaporation source 11a has a cathode holder 12 as described above, a plurality of cathodes 14 attached to the cathode holder 12, a trigger electrode 20 as described above, and a trigger drive unit 22a for driving the trigger electrode 20 mechanically instead of the trigger drive unit 22 in the related art.

In this embodiment, as is understood well with reference to FIG. 2, two cathodes 14 are arranged adjacently to each other and attached to the cathode holder 12. Each cathode 14 is electrically connected to a negative electrode of an arc power supply 28 through the cathode holder 12.

The plurality of cathodes 14 are preferably made to have the same shape and the same dimensions as one another. Thus, the manufacturing cost of the cathodes 14 can be reduced. It also becomes easy to attach the cathodes 14 to the cathode holder 12. Further, the structure of a shutter 32 which will be described later becomes simple. In this embodiment, the plurality of cathodes 14 have the same columnar shape and the same dimensions as one another by way of example.

In this embodiment, the trigger drive unit 22a perform two operations. One of the operations is to rotate the trigger electrode 20 through a shaft 24 reciprocatively as shown by the arrow C, so as to move the trigger electrode 20 to left and right and position the trigger electrode 20 in front of a desired one of the plurality (two in this embodiment) of the cathodes 14 (that is, in front of the position where a cathode material 16 should be evaporated). The other of the operations is to move the trigger electrode 20 forward/backward as shown by the arrow B in the position in front of the desired cathode 14, so as to connect/disconnect the trigger electrode 20 to/from the cathode 14. The cathode 14 where the trigger electrode 20 is positioned can be used.

The arc evaporation source 10a further includes a shutter 32 and a shutter drive unit 34. The shutter 32 can cover all the cathodes 14 except the desired cathode for the plurality (two in this embodiment) of cathodes 14. The shutter drive unit 34 rotates a shaft 36 reciprocatively as shown by the arrow D to thereby move the shutter 32 to left and right through the shaft 36, an arm 37 and a feedthrough 38, so as to change over the cathode 14 not covered with the shutter 32 (in other words, opened or used, the same meaning will be established below) alternatively. The feedthrough 38 has a vacuum seal function and an electrical insulating function in this embodiment.

The shutter 32 and the trigger electrode 20 are disposed not to interfere with each other even if they are rotated simultaneously. For example, in this embodiment, the shaft. 24 of the trigger electrode 20 and the shaft 36 of the shutter 32 are disposed in positions opposite to each other with the cathode holder 12 interposed therebetween, and the trigger electrode 20 is positioned outside the shutter 32.

In this embodiment, the shutter 32 has a disc-like shape a little larger than each cathode 14. When the position of the shutter 32 is changed over as shown by the arrow D, the front of a desired one of the two cathodes 14 can be covered with the shutter 32.

The vacuum arc deposition apparatus further has a changeover control unit 40. The changeover control unit 40 makes a changeover control to control the shutter drive unit 34 and the trigger drive unit 22a so as to change over a cathode 14 not covered with the shutter 32 alternatively while, for example, synchronously therewith, positioning the trigger electrode 20 in front of the cathode 14 not covered with the shutter 32. For example, in this embodiment, the changeover control unit 40 performs a changeover control as follows. That is, when one (right) cathode 14 is covered with the shutter 32, the trigger electrode 20 is positioned to the other (left) cathode 14 side as shown by the solid line in FIG. 2. On the other hand, when the other (left) cathode 14 is covered with the shutter 32, the trigger electrode 20 is positioned to the one (right) cathode 14 side as shown by the chain double-dashed line in FIG. 2.

When such changeover operations were carried out in the trigger drive unit 22a and the shutter drive unit 34 independently of each other, there might occur an abnormal behavior to bring the trigger electrode 20 into contact with the cathode 14 covered with the shutter 32. However, such an abnormal behavior can be prevented by the changeover control unit 40.

The angles with which the shutter 32 and the trigger electrode 20 should be rotated in the aforementioned changeover control depend on the structure such as the distance between the two cathodes 14, the distance between the shaft 36 of the shutter 32 and the two cathodes 14, and the distance between the shaft 24 of the trigger electrode 20 and the two cathodes 14. The angles may be set in advance, for example, in the changeover control unit 40.

Figure 3:
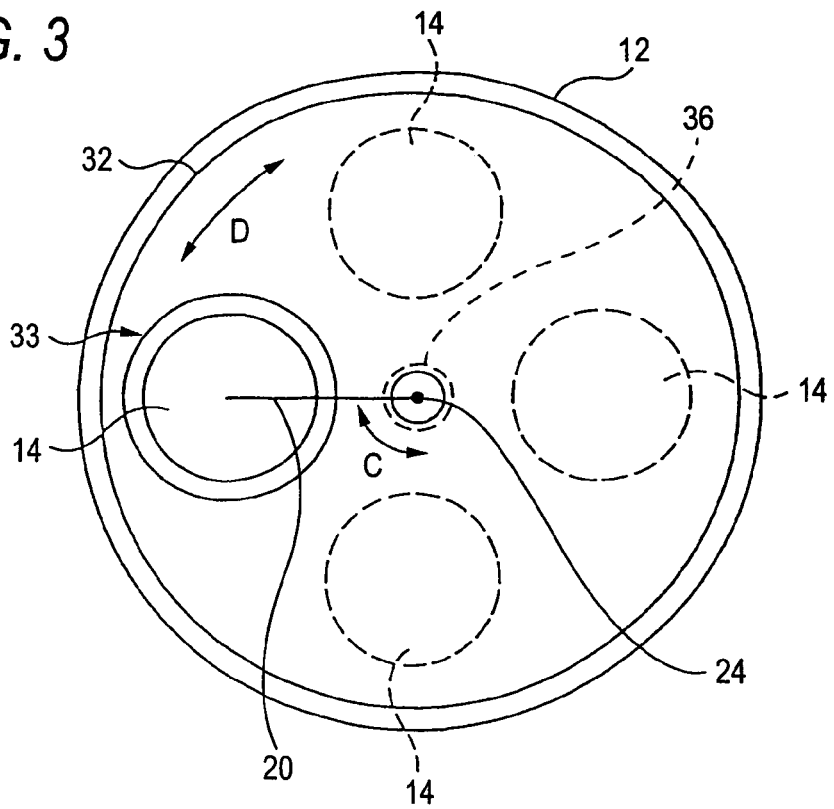
FIG. 3 is a front view showing another example of the vicinity of cathodes of an arc evaporation source in the vacuum arc deposition apparatus according to the invention, viewed in the arrow P direction in FIG. 1.

The number of cathodes 14 attached to the cathode holder 12 may be larger than two. FIG. 3 shows an example in which the number of cathodes 14 is four. In this example, the four cathodes 14 are disposed on the same circumference.

In this example, the shutter 32 is formed into a disc-like shape to cover the four cathodes 14 as a whole, and designed to have an opening portion 33 partially. The opening portion 33 is a little larger than each cathode 14 so as to expose only one cathode 14 therefrom. With such a structure, the shutter 32 can cover the fronts of all the cathodes 14 except a desired cathode.

In order avoid the interference of the shutter 32 and the trigger electrode 20 with each other, in this example, the shaft 24 for driving the trigger electrode 20 and the shaft 36 shaped in a hollow shape for driving the shutter 32 are disposed coaxially with each other so that the former is located inside the latter while the shafts 24 and 36 are positioned in the center of the circle with which the four cathodes 14 are disposed. The trigger electrode 20 is positioned outside the shutter 32 for the cathode holder 12, that is, a surface of the cathode 14 from which the cathode material 16 is evaporated. The shafts 24 and 36 are electrically insulated from each other.

The trigger drive unit 22a is coupled with the shaft 24 while the shutter drive unit 34 is coupled with the shaft 36. The trigger drive unit 22a and the shutter drive unit 34 can be disposed not to interfere with each other mechanically by a known technique.

The shutter 32 is rotated by a predetermined angle (90 degrees in this example) at one time by the shutter drive unit 34 as shown by the arrow D while the trigger electrode 20 is rotated by a predetermined angle (90 degrees in this example) at one time by the trigger drive unit 22a as shown by the arrow C. Then, these rotations are controlled by the changeover control unit 40 in the same manner as in the example of FIG. 2. That is, the changeover control unit 40 performs a changeover control to change over a cathode 14 not to-be covered with the shutter 32 (that is, to be exposed from the opening portion 33) alternatively while positioning the trigger electrode 20 in front of the cathode 14 exposed from the opening portion 33.

The structure in FIG. 3 can be also applied to the case where the number of cathodes 14 is a plural number other than four. For example, it can be applied to the case where the number of cathodes 14 is two, three, five, or the like. When the number of cathodes 14 is $n$ ($n$ is an integer not smaller than 2), the plurality of cathodes 14 may be disposed at an equal interval of $360/n$ degrees on the same circumference while the shutter 32 and the trigger electrode 20 are rotated by the angle of $360/n$ degrees at one time under the control of the changeover control unit 40.

According to the vacuum arc deposition apparatus, one arc evaporation source 10a has a plurality of cathodes 14, and the changeover control unit 40 can change over a cathode 14 not covered with the shutter 32 alternatively while positioning the trigger electrode 20 in front of the cathode 14 not covered with the shutter 32. Thus, the plurality of cathodes 14 can be used while being changed over alternatively in the condition that the vacuum chamber 2 is not opened to the atmosphere. It is therefore possible to perform the film deposition operation on the substrate: 4 continuously by use of the plurality of cathodes 14.

On that occasion, in this vacuum arc deposition apparatus, not only is the position of the trigger electrode 20 changed over to thereby change over the cathode 14 to be used, but all the cathodes 14 except the cathode 14 to be used are also covered with the shutter 32. Accordingly, (a) the cathode material 16 evaporated from the cathode 14 in use can be prevented from adhering to the surface of any other unused cathode 14 by the shutter 32. Further, (b) arc discharge in the cathode 14 in use can be prevented from shifting to another unused cathode 14 to thereby cause undesired arc discharge by the shutter 32.

The kinds (materials) of the plurality of cathodes 14 provided in the single arc evaporation source 10a may be made the same as one another or different from one another, or cathodes 14 of the same kind and of different kinds may be mixed in the single arc evaporation source 10a. For example, when the number of cathodes 14 is two, the both may be of the same kind A, or of different kinds in such a manner that one is of the kind A while the other is of another kind B. When the number of cathodes 14 is three, all the three may be of the same kind A, or the three may be of different kinds A, B and C from one another. Alternatively, for example, two of the same kind A and one of another kind B may be mixed.

When the kinds of cathodes are made the same as one another, the film deposition time on the substrate 4 can be prolonged in accordance with the number of cathodes 14 in comparison with that when the number of cathodes 14 is one. For example, when the cathodes 14 have the same dimensions, the film deposition time can be prolonged as many times as the number of cathodes 14.

When the kinds of cathodes are made different from one another, a wide variety of films can be formed on the substrate 4 in accordance with the number of cathodes 14. Thus, the degree of freedom to form a laminated film can be enhanced in comparison with when the number of cathodes 14 is one. In this case, the effect in the paragraph (a) due to the fact that all the cathodes 14 except the cathode 14 in use are covered with the shutter 32 is particularly effective. That is, if there were, among the unused cathodes 14, a cathode 14 not covered with the shutter 32, the cathode material 16 evaporated from the cathode 14 in use (which will be referred to as "first cathode") would adhere to the surface of the cathode 14 not covered with the shutter 32 (which cathode will be referred to as "second cathode"). When a film is next formed with the second cathode 14, the cathode material 16 adhering to the second cathode 14 would be evaporated so that a film having a composition different from an intended composition would be formed on the substrate 4 for a while. According to this vacuum arc deposition apparatus, such a problem can be prevented.

When cathodes 14 of the same kind and of different kinds are mixed, not only is it possible to prolong the film deposition time but it is also possible to enhance the degree of freedom to form a laminated film.

For example, the changeover control unit 40 performs the changeover control in response to a changeover instruction given from the outside (for example, an operator or the like). More specifically, an operator may decide the changeover time and give a changeover instruction to the changeover control unit 40 so that the changeover control unit 40 can carry out the changeover control in response to the changeover instruction. Alternatively, the changeover control may be carried out automatically in the following manner.

That is, as shown in the embodiment of FIG. 1, an arc current integrator 42 may be further provided for integrating an arc current $I_A$ flowing into the arc power supply 28 via the cathode holder 12 during current-carrying time $t$ so as to obtain an arc current amount Q ($=I_A \cdot t$) Then, the changeover control unit 40 is designed to carry out the changeover control whenever the arc current amount Q obtained by the arc current integrator 42 exceeds a predetermined reference value $R_1$. The arc current amount Q obtained by the arc current integrator 42 is supplied to .the changeover control unit 40. In addition, the reference value $R_1$ is set in the changeover control unit 40.

The arc current amount Q obtained by the arc current integrator 42 is proportional to the degree of consumption of the cathode 14 which is in use at that time. Accordingly, with the configuration, a cathode 14 to be used can be changed over automatically whenever the consumption of the cathode 14 in use reaches a predetermined quantity of consumption.

It is preferable that the arc current amount Q obtained by the arc current integrator 42 is, for example, reset to zero whenever the cathode 14 to be used is changed over. In such a manner, the reference value $R_1$ can be set so easily that the control becomes easy. For example, when the plurality of cathodes 14 are of the same kind, it will go well if one reference value $R_1$ is set. Thus, the control becomes very easy.

In spite of the same arc current amount Q, the quantity of consumption of one kind of cathode 14 may differ from that of another kind of cathode 14. Therefore, when different kinds of cathodes 14 are mixed in the plurality of cathodes 14, the reference value $R_1$ may be changed over in accordance with the kind of the cathode 14 located in position for use. In such a manner, even if different kinds of cathodes 14 are mixed, the cathode 14 to be used can be changed over automatically whenever the consumption of any cathode 14 in use reaches a substantially fixed quantity of consumption.

For example, the shutter 32 is made from metal. In that case, as shown in the vacuum arc deposition apparatus according to this embodiment, it is preferable that the shutter 32 is connected to the anode or the vacuum chamber 2 also serving as an anode, in other words, to the positive side of the arc power supply 28 through a resistor 44. The resister 44 is electrically connected to the shutter 32 via the conductive shaft 36 in this embodiment.

With such a configuration, the resistor 44 can prevent the shutter 32 from floating electrically, while the resistor 44 can reduce the occurrence of abnormal discharge between the shutter 32 and the cathode 14. This is due to the resistor 44 put between the positive electrode of the arc power supply 28 (in other words, the anode or the vacuum chamber 2 also serving as the anode) and the shutter 32. That is, when discharge is about to occur from the cathode 14 toward the shutter 32, the current flowing into the resistor 44 increases so that a voltage drop in the resistor 44 increases to block the abnormal discharge.

Further, as in this embodiment, there may be provided an ampere meter 46 and a shut-down control unit 48. The ampere meter 46 measures a current $I_s$ flowing into the shutter 32 via the resistor 44. The shut-down control unit 48 makes a shut-down control for shutting down the output of the arc power supply 28 when the current $I_s$ measured by the ampere meter 46 exceeds a predetermined reference value $R_2$.

The reference value $R_2$ is set in the shut-down control unit 48. When the current $I_s$ exceeds the reference value $R_2$, shut-down signal S is supplied from the shut-down control unit 48 to the arc power supply 28. The arc power supply 28 shuts down its output in response to the shut-down signal S.

During arc discharge produced in one cathode 14, a slight (for example, about 1 or 2 A) current $I_s$ may flow into the shutter 32 due to the influence of the arc discharge even at normal time. Thus, the reference value $R_2$ may be preferably set at a value (for example, about 10 A) larger than the current $I_s$ to some extent.

With such a configuration, when the current $I_s$ flowing into the shutter 32 exceeds the predetermined reference value $R_2$ for some reason, the output of the arc power supply 28 can be shut down automatically by the shut-down control unit 48. Thus, abnormal discharge in the shutter 32 can be prevented more surely.

With the configuration as described above, the invention can obtain the following effects.

According to the invention, a plurality of cathodes in an arc evaporation source can be used while being changed over in the condition that a vacuum chamber is not opened to the atmosphere. It is therefore possible to prolong the film deposition time on a substrate or to enhance the degree of freedom to form a laminated film.

In addition, according to the invention, not only is the position of a trigger electrode changed over to change over a cathode to be used, but all the cathodes except the cathode to be used are also covered with a shutter. Accordingly, the cathode material evaporated from the cathode in use can be prevented from adhering to the surface of any other unused cathode by the shutter. Further, arc discharge in the cathode in use can be prevented from shifting to another unused cathode to thereby cause undesired arc discharge by the shutter.

According to the invention, an arc current integrator and a changeover control unit are provided as described above. Thus, there is another effect that a cathode to be used can be changed over automatically whenever the consumption of the cathode in use reaches a predetermined quantity of consumption.

According to the invention, a resistor, an ampere meter and a shut-down control unit are provided as described above. Thus, there is another effect as follows. That is, it is possible to prevent the shutter from floating electrically, while it is possible to reduce the occurrence of abnormal discharge between the shutter and the cathode. In addition, when the current flowing into the shutter exceeds a predetermined reference value for some reason, the output of an arc power supply can be shut down automatically by the shut-down control unit. Thus, abnormal discharge in the shutter can be prevented more surely.

What is claimed is:

1. A vacuum arc deposition apparatus comprising:
    a vacuum chamber;
    an arc evaporation source for evaporating a cathode material from a plurality of cathodes due to vacuum arc discharge, said arc evaporation source including
        a cathode holder made from a conductor for holding said plurality of cathodes,
        said plurality of cathodes attached to said holder,
        a trigger electrode for arc ignition,
        a trigger drive unit for performing an operation to change over a position of said trigger electrode to a changed-over position to thereby position said trigger electrode in front of a desired one of said plurality of cathodes and an operation to move said trigger electrode toward or to get apart from said desired one of said plurality of cathodes in said changed-over position,
        a shutter capable of covering fronts of all of said plurality of cathodes except said desired one of said plurality of cathodes, and
        a shutter drive unit for performing an operation to move said shutter to thereby change over to a cathode of said plurality of cathodes not covered with said shutter;
    an arc power supply connected between said cathode holder of said arc evaporation source and an anode corresponding to said cathode holder with said plurality of cathodes on a negative side; and
    a changeover control unit for making a changeover control to control said shutter drive unit and said trigger drive unit so as to change over to a cathode of said plurality of cathodes not covered with said shutter while positioning said trigger electrode in front of a cathode of said plurality of cathodes not covered with said shutter.

2. A vacuum arc deposition apparatus according to claim 1, further comprising:
    an arc current integrator for integrating an arc current flowing into said arc power supply via said cathode holder during current-carrying time so as to obtain an arc current amount,
    wherein said changeover control unit performs said changeover control whenever said arc current amount obtained by said arc current integrator exceeds a predetermined reference value.

3. A vacuum arc deposition apparatus according to claim 1, wherein said shutter is made from metal, and said vacuum arc deposition apparatus further comprising:

a resistor connected between said shutter and said anode;

an ampere meter for measuring a current flowing into said shutter via said resistor; and a shut-down control unit for making a shut-down control for shutting down an output of said arc power supply when said current measured by said ampere meter exceeds a predetermined reference value.

4. A vacuum arc deposition apparatus according to claim 1, wherein said vacuum chamber serves as said anode.

5. A vacuum arc deposition apparatus according to claim 1, wherein said plurality of cathodes are two cathodes, and said shutter is larger than a surface, from which cathode material is evaporated, of one of the two cathodes so that said shutter covers the one of the two cathodes.

6. A vacuum arc deposition apparatus according to claim 1, wherein said shutter has an opening portion which is larger than a surface, from which cathode material is evaporated, of one of the plurality of cathodes, and said shutter covers surfaces, each from which cathode material is evaporated, of the other ones of the plurality of cathodes.

7. A vacuum arc deposition apparatus according to claim 1, wherein said trigger electrode and said shutter are disposed with different distances from surfaces of said plurality of cathodes each from which the cathode material is evaporated.

8. A vacuum arc deposition apparatus according to claim 1, wherein said plurality of cathodes are made of the same material.

9. A vacuum arc deposition apparatus according to claim 1, wherein said plurality of cathodes are made of different materials.

10. A vacuum arc deposition apparatus according to claim 1, wherein said plurality of cathodes are at least three cathodes where the at least three cathodes of the same kind and of different kinds are mixed.

* * * * *